(12) United States Patent
Kawaguchi et al.

(10) Patent No.: US 10,205,065 B2
(45) Date of Patent: Feb. 12, 2019

(54) LIGHT-EMITTING DEVICE

(71) Applicant: Sharp Kabushiki Kaisha, Sakai, Osaka (JP)

(72) Inventors: Yoshihiro Kawaguchi, Sakai (JP); Tomokazu Nada, Sakai (JP); Hiroaki Onuma, Sakai (JP); Makoto Matsuda, Sakai (JP); Osamu Jinushi, Sakai (JP); Toshio Hata, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/563,051

(22) PCT Filed: Feb. 22, 2016

(86) PCT No.: PCT/JP2016/055013
§ 371 (c)(1),
(2) Date: Sep. 29, 2017

(87) PCT Pub. No.: WO2016/158082
PCT Pub. Date: Oct. 6, 2016

(65) Prior Publication Data
US 2018/0069161 A1    Mar. 8, 2018

(30) Foreign Application Priority Data
Apr. 2, 2015 (JP) ................. 2015-075883

(51) Int. Cl.
*H01L 33/50* (2010.01)
*H01L 33/62* (2010.01)
(Continued)

(52) U.S. Cl.
CPC ............... *H01L 33/50* (2013.01); *F21K 9/64* (2016.08); *H01L 25/0753* (2013.01);
(Continued)

(58) Field of Classification Search
CPC .................. H01L 33/50; H01L 33/62; H01L 2224/48137; H01L 2224/73265;
(Continued)

(56) References Cited

U.S. PATENT DOCUMENTS

2008/0224608 A1*  9/2008  Konishi ................... F21K 9/00
                                                                    313/505
2011/0180817 A1   7/2011  Ishizaki et al.
(Continued)

FOREIGN PATENT DOCUMENTS

CN    103222077 A    7/2013
EP    3 101 700 A1  12/2016
(Continued)

*Primary Examiner* — Kevin Quarterman
(74) *Attorney, Agent, or Firm* — Birch, Stewart, Kolasch & Birch, LLP

(57) ABSTRACT

There is provided a light-emitting device including an anode electrode land, a cathode electrode land, and a first light-emitting unit and a second light-emitting unit electrically connected to the anode electrode land and the cathode electrode land and provided in parallel to each other, in which the first light-emitting unit and the second light-emitting unit each include blue light-emitting LED chips, the first light-emitting unit and the second light-emitting unit have different amounts of change in luminous flux with respect to an amount of change in current applied between the anode electrode land and the cathode electrode land, and a color temperature generated from an entire light-emitting unit including the first light-emitting unit and the second light-emitting unit can be adjusted.

5 Claims, 9 Drawing Sheets

(51) Int. Cl.
*H01L 25/075* (2006.01)
*F21K 9/64* (2016.01)
*H05B 33/08* (2006.01)
*F21Y 115/10* (2016.01)

(52) U.S. Cl.
CPC ......... *H01L 33/62* (2013.01); *H05B 33/0827* (2013.01); *H05B 33/0857* (2013.01); *F21Y 2115/10* (2016.08); *H01L 33/504* (2013.01); *H01L 2224/48137* (2013.01); *H01L 2224/73265* (2013.01)

(58) Field of Classification Search
CPC ... H05B 33/0857; H05B 33/0827; F21K 9/64; F21Y 2115/10
See application file for complete search history.

(56) References Cited

U.S. PATENT DOCUMENTS

| | | |
|---|---|---|
| 2011/0249431 A1 | 10/2011 | Tanaka |
| 2013/0162140 A1 | 6/2013 | Shamoto et al. |
| 2013/0257266 A1* | 10/2013 | Ishizaki ................ H01L 33/504 313/503 |
| 2014/0247597 A1 | 9/2014 | Abe et al. |
| 2015/0263246 A1* | 9/2015 | Hiramatsu .......... H01L 25/0753 362/231 |
| 2015/0308632 A1* | 10/2015 | Ueno ........................ F21S 8/02 362/235 |
| 2016/0131313 A1* | 5/2016 | Miwa ........................ F21K 9/60 362/231 |

FOREIGN PATENT DOCUMENTS

| | | |
|---|---|---|
| JP | 2009-224656 A | 10/2009 |
| JP | 2011-159809 A | 8/2011 |
| JP | 2011-222723 A | 11/2011 |
| JP | 2012-64925 A | 3/2012 |
| JP | 2014-103261 A | 6/2014 |
| JP | 2014-143307 A | 8/2014 |
| WO | WO 2014/017005 A1 | 1/2014 |
| WO | WO 2014/103671 A1 | 7/2014 |

* cited by examiner

LIGHT-EMITTING DEVICE

TECHNICAL FIELD

The present invention relates to light-emitting devices.

BACKGROUND ART

Halogen lamps have an energy distribution closely analogous to that of perfect radiators, and thus exhibit excellent color rendering properties. Furthermore, depending on the magnitude of supplied power to a halogen lamp, the color temperature of light emitted from the halogen lamp can be changed, and the halogen lamp is thus used as a visible light source. However, the halogen lamps have problems, such as producing infrared emission and thus becoming at very high temperatures, requiring a reflector plate for inhibiting infrared radiation, having a life shorter than that of LEDs, having large power consumption. Thus, developments of white-light light-emitting device with small heat generation using longer-life light-emitting diodes (LEDs) have been performed.

In PTL 1 (Japanese Unexamined Patent Application Publication No. 2009-224656), a light-emitting device is disclosed which includes a base body having a recessed part where a plurality of tilted surfaces tilted in direction opposing to one another are formed on a bottom surface, light-emitting elements installed on the respective tilted surfaces, and wavelength converting members provided so as to cover the respective light-emitting elements to convert light emitted from the respective light-emitting elements into lights with wavelengths different from one another.

In PTL 2 (Japanese Unexamined Patent Application Publication No. 2011-159809), a white-light light-emitting device is disclosed which includes a first white-light generating system formed of ultraviolet or violet LED chips and phosphors to generate first white light and a second white-light generating system formed of blue LED chips and phosphors to generate second white light. The first and second white-light generating systems are spatially separated, the first white light has a color temperature lower than that of the second white light, and the white-light light-emitting device is configured to be able to emit mixed light including the first white light and the second white light.

In PTL 3 (Japanese Unexamined Patent Application Publication No. 2011-222723), a light-emitting device is disclosed which has a light source unit with a resistor connected in series to a first LED so that a ratio of a luminous flux of the first LED and a luminous flux of a second LED is not constant with a change in output voltage of a power source device.

CITATION LIST

Patent Literature

PTL 1: Japanese Unexamined Patent Application Publication No. 2009-224656
PTL 2: Japanese Unexamined Patent Application Publication No. 2011-159809
PTL 3: Japanese Unexamined Patent Application Publication No. 2011-222723

SUMMARY OF INVENTION

Technical Problem

In the techniques of PTL 1 and PTL 2, power is supplied from different power sources to each light-emitting element. Thus, there are problems in which a plurality of wiring patterns are required and the structure of the light-emitting device becomes complex.

In the technique of PTL 3, the light source unit has a resistor. Thus, there is a problem in which a power loss at the resistor increases in accordance with an increase in charged power to decrease luminous efficiency of the light-emitting device.

The present invention was made to resolve the above-described problems, and has an object of providing a light-emitting device capable of adjusting color temperature by power supply from a single power source.

Solution to Problem

[1] A light-emitting device of the present invention is a light-emitting device including an anode electrode land, a cathode electrode land, and a first light-emitting unit and a second light-emitting unit electrically connected to the anode electrode land and the cathode electrode land and provided in parallel to each other, in which the first light-emitting unit and the second light-emitting unit each include blue light-emitting LED chips, the first light-emitting unit and the second light-emitting unit have different amounts of change in luminous flux with respect to an amount of change in current applied between the anode electrode land and the cathode electrode land, and a color temperature generated from an entire light-emitting unit including the first light-emitting unit and the second light-emitting unit can be adjusted.

[2] In the light-emitting device of the present invention, preferably, the first light-emitting unit and the second light-emitting unit each include a different number of the blue light-emitting LED chips.

[3] In the light-emitting device of the present invention, preferably, the blue light-emitting LED chips included in the first light-emitting unit and the blue light-emitting LED chips included in the second light-emitting unit have different amounts of change in forward-direction current with respect to an amount of change in applied voltage (forward current-forward voltage characteristics).

[4] In the light-emitting device of the present invention, preferably, the first light-emitting unit includes a plurality of first piece light-emitting units connected in series, and the second light-emitting unit includes a plurality of second piece light-emitting units connected in series.

[5] In the light-emitting device of the present implementation, preferably, the first light-emitting unit and the second light-emitting unit each include phosphors of at least two types, and a content rate of all phosphors included in the first light-emitting unit and a content rate of all phosphors included in the second light-emitting unit are different.

Advantageous Effects of Invention

According to the present invention, it is possible to provide a light-emitting device capable of adjusting color temperature by power supply from a single power source.

DESCRIPTION OF EMBODIMENTS

Figure 1:
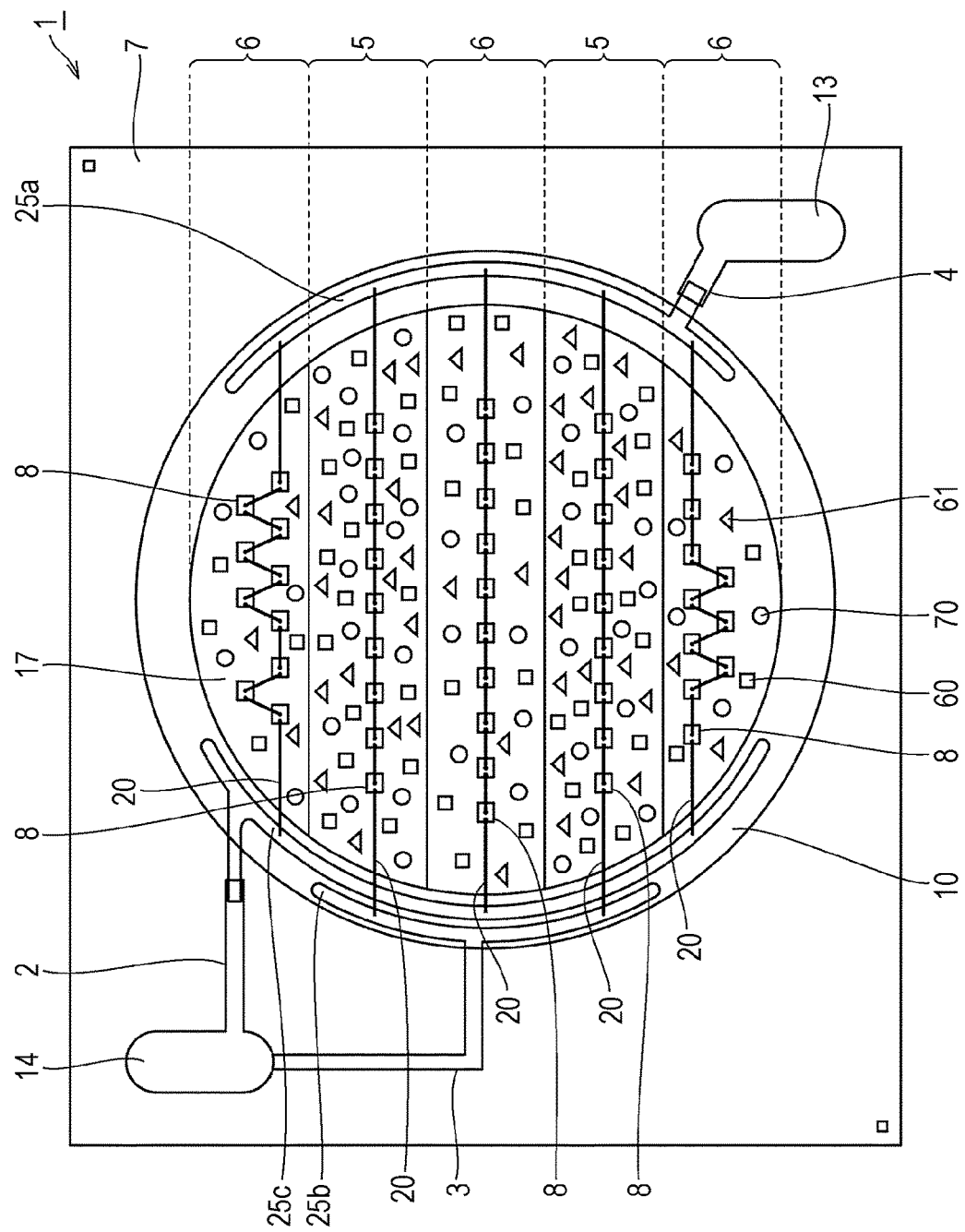
FIG. 1 is a transparent plan view schematically depicting a light-emitting device according to a first embodiment.

In the following, a light-emitting device of the present invention is described by using the drawings. Note that the same reference characters represent the same portion or corresponding portion in the drawings of the present invention. Also, dimensional relations regarding length, width, thickness, depth, and so forth are changed as appropriate for the purpose of clarification and simplification of the drawings, and do not represent actual dimensional relations.

[First Embodiment]

Figure 2:
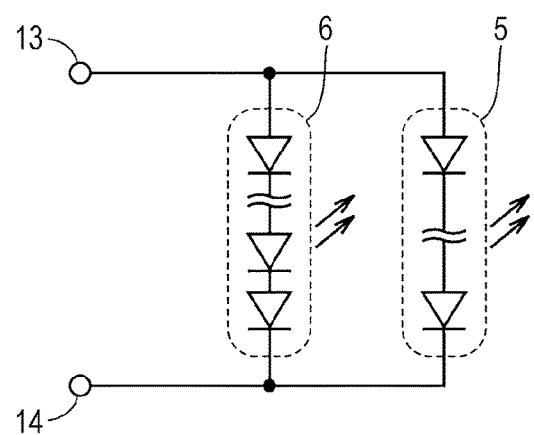
FIG. 2 is a schematic circuit diagram of the light-emitting device of FIG. 1.

A light-emitting device according to a first embodiment is described by using FIG. 1 and FIG. 2. FIG. 1 is a transparent plan view schematically depicting the light-emitting device according to the first embodiment of the present invention. FIG. 2 is a schematic circuit view of the light-emitting device of FIG. 1.

As depicted in FIG. 1 and FIG. 2, a light-emitting device 1 includes, on a substrate 7, an anode electrode land 13, a cathode electrode land 14, and first light-emitting units 5 at two locations and second light-emitting units 6 at three locations electrically connected to the anode electrode land 13 and the cathode electrode land 14 and provided in parallel. The first light-emitting units 5 and the second light-emitting units 6 are alternately and adjacently arranged.

The anode electrode land 13 and each of the first light-emitting units 5 at two locations are electrically connected via a lead wiring 4 connected to the anode electrode land 13, a wiring pattern 25a connected to the lead wiring 4, and a wire 20 connected to the wiring pattern 25a. The cathode electrode land 14 and each of the first light-emitting units 5 at two locations are electrically connected via a lead wiring 3 connected to the cathode electrode land 14, a wiring pattern 25b connected to the lead wiring 3, and a wire 20 connected to the wiring pattern 25b.

The anode electrode land 13 and each of the second light-emitting units 6 at three locations are electrically connected via the lead wiring 4 connected to the anode electrode land 13, the wiring pattern 25a connected to the lead wiring 4, and a wire 20 connected to the wiring pattern 25a. The cathode electrode land 14 and each of the second light-emitting units 6 at three locations are electrically connected via a lead wiring 2 connected to the cathode electrode land 14, a wiring pattern 25c connected to the lead wiring 2, and a wire 20 connected to the wiring pattern 25c.

Each of the first light-emitting units 5 at two locations includes first red phosphors 60, second red phosphors 61, green phosphors 70, blue light-emitting LED chips 8, and a light-transmitting resin 17. In each of the first light-emitting units 5, nine blue light-emitting LED chips 8 are connected in series via the wire 20.

Each of the second light-emitting units 6 at three locations includes first red phosphors 60, second red phosphors 61, green phosphors 70, blue light-emitting LED chips 8, and a light-transmitting resin 17. In each of the second light-emitting unit 6, ten blue light-emitting LED chips 8 are connected in series via the wire 20.

Outside the first light-emitting units 5 at two locations and the second light-emitting units 6 at three locations, a resin dam 10 is formed. The wiring patterns 25a, 25b, and 25c and part of the wires 20 are covered with the resin dam 10.

In the light-emitting device 1, the first light-emitting units 5 and the second light-emitting units 6 emit light by power supply from a single power source. Lights emitted from the first light-emitting units 5 and lights emitted from the second light-emitting units 6 are mixed and emitted outside as light from the light-emitting device 1.

In the light-emitting device 1, the number of blue light-emitting LED chips 8 included in the first light-emitting unit 5 is nine, and the number of blue light-emitting LED chips 8 included in the second light-emitting unit 6 is ten. The numbers of blue light-emitting LED chips 8 included in the respective light-emitting units are different.

Figure 3:
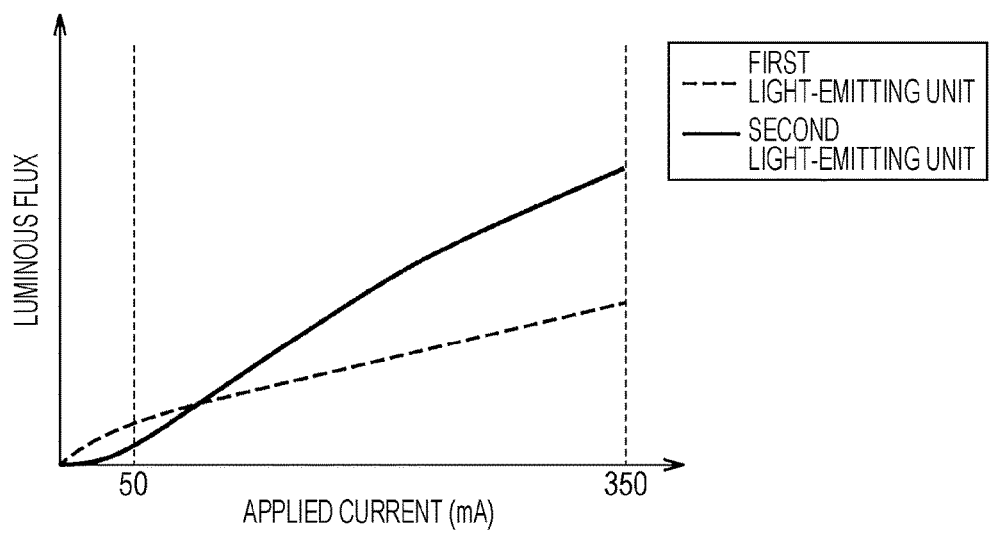
FIG. 3 is a graph depicting a relation between applied current and luminous flux of light emitted from each light-emitting unit in the light-emitting device of FIG. 1.

Using a graph of FIG. 3, a description is made about changes in luminous flux of light emitted from each of the first light-emitting unit 5 and the second light-emitting unit 6 when the current value of current applied to the light-emitting device 1 is gradually increased from a state in which no current is let flow through the light-emitting device 1.

When the current value of current applied to the light-emitting device 1 is gradually increased from a state in which no current is let flow through the light-emitting device 1, firstly, current gradually flows through the first light-emitting unit 5, causing the first light-emitting unit 5 to emit light. Here, current hardly flows through the second light-emitting unit 6. That is, when the current value of the current applied to the light-emitting device 1 is small, a luminous flux $\phi 1$ of light emitted from the first light-emitting unit is larger than a luminous flux $\phi 2$ of light emitted from the second light-emitting unit. Subsequently, when the current value of the current applied to the light-emitting device 1 is gradually increased, current starts flowing through the first light-emitting unit 5 and also the second light-emitting unit 6, causing the second light-emitting unit to also emit light. Subsequently, when the current value applied to the light-emitting device 1 is further increased, the luminous flux $\phi 2$ of light emitted from the second light-emitting unit becomes larger than the luminous flux $\phi 1$ of light emitted from the first light-emitting unit.

As depicted in the graph of FIG. 3, the first light-emitting unit 5 and the second light-emitting unit 6 have different amounts of change in the luminous flux with respect to the amount of change in current applied between the anode electrode land 13 and the cathode electrode land 14. When the magnitude of current applied to the light-emitting device 1 is changed, the color temperature of light emitted from the first light-emitting unit 5 and the color temperature of light emitted from the second light-emitting unit 6 are not changed, but a luminous flux ratio of light emitted from each light-emitting unit is changed. Therefore, the color temperature of light from the entire light-emitting unit, which is mixed light of lights from the first light-emitting unit 5 and the second light-emitting unit 6, can be changed.

(Anode Electrode Land, Cathode Electrode Land, Lead Wirings, Wiring Patterns, and Resin Dam)

The anode electrode land 13 and the cathode electrode land 14 are electrodes for external connection (for example, for the purpose of power supply), and are made of a material such as Ag—Pt. The anode electrode land 13 and the cathode electrode land 14 are provided so as to be exposed outside the resin dam 10.

The lead lines are made of 2, 3, 4, Ag—Pt, or the like, and are formed by a screen printing method or the like.

The wiring patterns 25a, 25b, and 25c are made of Ag—Pt or the like, and are formed by a screen printing method or the like.

The resin dam 10 is a resin for holding back the first light-emitting units 5 and the second light-emitting units 6 including the light-transmitting resin 17, and is preferably configured of a colored material (which may be a colored material with less light absorption such as white, milk white, red, yellow, or green). The resin dam 10 is preferably formed so as to cover the wiring patterns 25a, 25b, and 25c to decrease absorption of light radiated from the blue light-emitting LED chips or light converted by the phosphors.

(First Light-Emitting Units and Second Light-Emitting Units)

The first light-emitting units 5 and the second light-emitting units 6 (hereinafter also referred to as a "light-emitting unit" including both units) include the blue light-emitting LED chips 8, the light-transmitting resin 17, and the first red phosphors 60, the second red phosphors 61, and the green phosphors 70 uniformly dispersed in the light-transmitting resin.

In FIG. 1, the first light-emitting units 5 and the second light-emitting units 6 are arranged inside the same circle. The circle is divided into five by four parallel lines that are axisymmetric. The second light-emitting units 6 are arranged in one center section and two sections on both sides, and the first light-emitting units 5 are arranged in the remaining two sections interposed by the second light-emitting units 6. In FIG. 1, the first light-emitting units 5 and the second light-emitting units 6 are adjacent on boundary lines, and lights emitted from the light-emitting units of the respective first light-emitting units 5 and second light-emitting units 6 thus become easily mixed, allowing the entire light-emitting unit to emit light at a more uniform color temperature. Note that although the first light-emitting units 5 and the second light-emitting units 6 are preferably arranged adjacently, the first light-emitting units 5 and the second light-emitting units 6 do not have to make contact with each other as long as lights emitted from the light-emitting units of the respective first light-emitting units 5 and second light-emitting units 6 can be mixed together. In this case, the first light-emitting units 5 and the second light-emitting units 6 are preferably arranged in a distance as near as lights emitted from the respective light-emitting units can be sufficiently mixed together.

The shape of the entire light-emitting unit including the first light-emitting units 5 and the second light-emitting units 6 is not limited to the circle as in FIG. 1 as long as lights emitted from the light-emitting units of the respective first light-emitting units 5 and second light-emitting units 6 can be mixed. For example, as the shape of the entire light-emitting unit, any shape can be adopted, such as a substantially rectangular shape, a substantially oval shape, or a polygon. The shape of each of the first light-emitting units 5 and the second light-emitting units 6 arranged inside the entire light-emitting unit is also not particularly limited. For example, it is preferable to form a shape so that the surface area of the first light-emitting unit 5 and the surface area of the second light-emitting unit 6 are equal to each other. This shape can be acquired by, for example, arranging the first light-emitting unit 5 in a first section acquired by equally dividing the entire light-emitting unit having a shape such as a circle, rectangle, oval, or regular polygon by a line passing through the center into two and arranging the second light-emitting unit 6 in a second section.

Also, if the color temperature of light emitted from the light-emitting unit of each of the first light-emitting units and the second light-emitting units can be adjusted, the surface area of the first light-emitting unit and the surface area of the second light-emitting unit may be different. For example, the first light-emitting unit can be formed in a circular shape, and the second light-emitting unit can be arranged in a donut shape so as to surround the outer periphery of the first light-emitting unit. According to this, lights emitted from the light-emitting units of the respective first light-emitting unit and second light-emitting unit become easily mixed, allowing the entire light-emitting unit to emit light at a more uniform color temperature.

In the light-emitting unit, part of primary light (for example, blue light) radiated from the blue light-emitting LED chips 8 is converted by the green phosphors and the red phosphors into green light and red light. Thus, the light-emitting device according to the present embodiment emits light with the primary light, the green light, and the red light mixed together, and suitably emits white-based light. Note that a mixture ratio of the green phosphors and red phosphors is not particularly restricted, and the mixture ratio is preferably set so that a desired characteristic is achieved. Also, the content rate of all phosphors included in the first light-emitting unit 5 and the content rate of all phosphors included in the second light-emitting unit 6 are preferably different.

By changing the magnitude of current flowing through each of the first light-emitting unit 5 and the second light-emitting unit 6, the luminous flux of light emitted from the first light-emitting unit 5 and the luminous flux of light emitted from the second light-emitting unit 6 can be adjusted.

When the current flowing through the light-emitting unit is set to have a rated current value, the color temperature (hereinafter also referred to as Tcmax) of light emitted from the entire light-emitting device with a mixture of lights emitted from the first light-emitting units 5 and lights emitted from the second light-emitting units 6 is preferably 2700 K to 6500 K. If the magnitude of current is set smaller than the rated current value, the luminous fluxes of lights emitted from the first light-emitting units 5 and the second light-emitting units 6 become smaller, the luminous flux of light emitted from the entire light-emitting device (light-emitting unit) becomes smaller, and the color temperature is decreased. With the luminous flux of light emitted from the entire light-emitting device being taken as 100% when the current flowing through the light-emitting unit is set to have a rated current value and the luminous flux of light emitted from the entire light-emitting device being adjusted to be 20% by making the magnitude of current smaller, the color temperature of light emitted from the entire light-emitting device is preferably smaller than Tcmax by 300 K or more, in view of allowing acquirement of a wide range of color temperatures.

(Blue Light-Emitting LED Chips)

The blue light-emitting LED chips 8 radiate light including light with blue components having a peak luminous wavelength present in a blue region (a region with a wavelength equal to or longer than 430 nm and equal to or shorter than 480 nm). When LED chips with a peak luminous wavelength shorter than 430 nm are used, a contribution ratio of the blue-light components with respect to light from the light-emitting device is low, inviting degradation in color rendering properties. Thus, a decrease in practicality of the light-emitting device may be invited. When LED chips with a peak luminous wavelength exceeding 480 nm are used, a decrease in practicality of the light-emitting device may be invited. In particular, in InGaN-based LED chips, quantum efficiency is decreased, and thus a decrease in practicality of the light-emitting device is conspicuous.

The blue light-emitting LED chips 8 are preferably InGaN-based blue light-emitting LED chips. An example of the blue light-emitting LED chips 8 can be blue light-emitting LED chips with a peak luminous wavelength near 450 nm. Here, the "InGaN-based blue light-emitting LED chips" mean blue light-emitting LED chips in which a light-emitting layer is an InGaN layer.

The blue light-emitting LED chips 8 each have a structure in which light is radiated from its upper surface. Also, for connection of the blue light-emitting LED chips 8 adjacent to each other via the wire 20 and connection of the blue light-emitting LED chips 8 and the wiring patterns 25a, 25b, and 25c via the wire 20, the blue light-emitting LED chip 8 has an electrode pad on its surface.

In the present embodiment, the number of blue light-emitting LED chips 8 connected in series and included in the first light-emitting unit 5 and the number of blue light-emitting LED chips 8 connected in series and included in the second light-emitting unit are made different, thereby making the amount of change in luminous flux of light emitted from the first light-emitting unit 5 with respect to the amount of change in current applied to the light-emitting device 1 and the amount of change in luminous flux of light emitted from the second light-emitting unit 6 with respect to the amount of change in current applied to the light-emitting device 1 different. In the present embodiment, it is possible to dispense with means which connects resistors to the lead wirings 2, 3, and 4 to change the magnitude of current flowing through the first light-emitting units 5 and the second light-emitting units 6. Therefore, the light-emitting device 1 can decrease a power loss due to resistors and can have excellent luminous efficiency even if the value of the applied current increases.

The number of blue light-emitting LED chips 8 connected in series and included in the first light-emitting unit 5 and the number of blue light-emitting LED chips 8 connected in series and included in the second light-emitting unit are not particularly limited as long as they are different. Also, either of the number of blue light-emitting LED chips 8 included in the first light-emitting unit 5 or the number of blue light-emitting LED chips 8 included in the second light-emitting unit 6 can be larger.

(Light-transmitting Resin)

The light-transmitting resin 17 included in the light-emitting unit is not limited as long as it is a resin with light transmittance. For example, an epoxy resin, silicone resin, urea resin, or the like is preferable.

The viscosity of the light-transmitting resin including the phosphors forming the first light-emitting unit 5 and the viscosity of the light-transmitting resin including the phosphors forming the second light-emitting unit 6 are preferably different. According to this, after a light-emitting unit made of a light-transmitting resin with high viscosity is formed, a light-emitting unit made of a light-transmitting resin with low viscosity is formed, allowing the light-emitting unit formed formerly to serve as a resin dam for the light-emitting unit formed later. Also, if the viscosity of the light-transmitting resin including the phosphors forming the first light-emitting unit 5 and the viscosity of the light-transmitting resin including the phosphors forming the second light-emitting unit 6 are different, mixture and intrusion of the phosphors included in each light-emitting unit can be reduced.

(Red Phosphors)

The first red phosphors 60 and the second red phosphors 61 (hereinafter also referred to as a "red phosphor" including both phosphors) are excited by primary light radiated from the blue light-emitting LED chips 8, and radiate light with a peak luminous wavelength in a red region. The red phosphor neither emits light in a wavelength range equal to or longer than 700 nm nor absorbs light in a wavelength range equal to or longer than 550 nm and equal to or shorter than 600 nm. "The red phosphor does not emit light in a wavelength range equal to or longer than 700 nm" means that the light emission intensity of the red phosphor in the wavelength range equal to or longer than 700 nm at a temperature equal to or higher than 300 K is equal to or smaller than $1/100$ times of the light emission intensity of the red phosphor in the peak luminous wavelength. "The red phosphor does not absorb light in a wavelength range equal to or longer than 550 nm and equal to or shorter than 600 nm" means that an integral value of an excitation spectrum of the red phosphor in the wavelength range equal to or longer than 550 nm and equal to or shorter than 600 nm at a temperature equal to or higher than 300 K is equal to or smaller than $1/100$ times of an integral value of an excitation spectrum of the red phosphor in a wavelength range equal to or longer than 430 nm and equal to or shorter than 480 nm. Note that the measured wavelength of the excitation spectrum is assumed to be a peak wavelength of the red phosphor. The "red region" means a region with a wavelength equal to or longer than 580 nm and shorter than 700 nm in the specification.

Light emission of the red phosphor can be hardly confirmed in a long wavelength region equal to or longer than 700 nm. In the long wavelength region equal to or longer than 700 nm, human luminosity is relatively small. Thus, when the light-emitting device is used for the purpose of, for example, lighting, it is a great advantage to use red phosphor.

Also, the red phosphor does not absorb light in a wavelength range equal to or longer than 550 nm and equal to or shorter than 600 nm, and is thus difficult to absorb secondary light from the green phosphors. This can inhibit an occurrence of two-step light emission, in which the red phosphor absorbs secondary light from the green phosphor and emits light. Therefore, luminous efficiency is highly kept.

The red phosphor is not particularly limited as long as it is used in a wavelength conversion unit of the light-emitting device. For example, a $(Sr, Ca)AlSiN_3$:Eu-based phosphor, $CaAlSiN_3$:Eu-based phosphor, or the like can be used.

(Green Phosphors)

The green phosphors 70 are excited by primary light radiated from the blue light-emitting LED chips 8, and radiate light with a peak luminous wavelength in a green region. The green phosphors are not particularly limited as long as they are used in a wavelength conversion unit of the light-emitting device. For example, a phosphor represented by a general formula (1): $(M1)_{3-x}Ce_x(M2)_5O_{12}$ (in the formula, (M1) represents at least one of Y, Lu, Gd, and La, (M2) represents at least one of Al and Ga, and x representing a composition ratio (concentration) of Ce satisfies $0.005 \leq x \leq 0.20$) or the like can be used. The "green region" means a region with a wavelength equal to or longer than 500 nm and equal to or shorter than 580 nm.

A half-width of a fluorescent spectrum of a green phosphor is preferably wider when a green phosphor of one type is used (for example, in the case of general lighting purpose), and is preferably, for example, equal to or longer than 95 nm. A phosphor with Ce as an activator, for example, a $Lu_{3-x}Ce_xAl_5O_{12}$-based green phosphor represented by the general formula (1), has a garnet crystal structure. This phosphor uses Ce as an activator, allowing a fluorescent spectrum with a wide half-width (a half-width equal to or longer than 95 nm) to be acquired. Thus, the phosphor with Ce as an activator is a suitable green phosphor for acquiring high color rendering properties.

(Additive)

The light-emitting unit may contain an additive such as, for example, $SiO_2$, $TiO_2$, $ZrO_2$, $Al_2O_3$, or $Y_2O_3$, other than the light-transmitting resin, the green phosphors, and the red phosphors. If the light-emitting unit contains an additive as described above, it is possible to acquire an effect of inhibiting settling of phosphors such as the green phosphors and the red phosphors or an effect of efficiently diffusing light from the blue light-emitting LED chips, the green phosphors, and the red phosphors.

[Second Embodiment]

Figure 5:
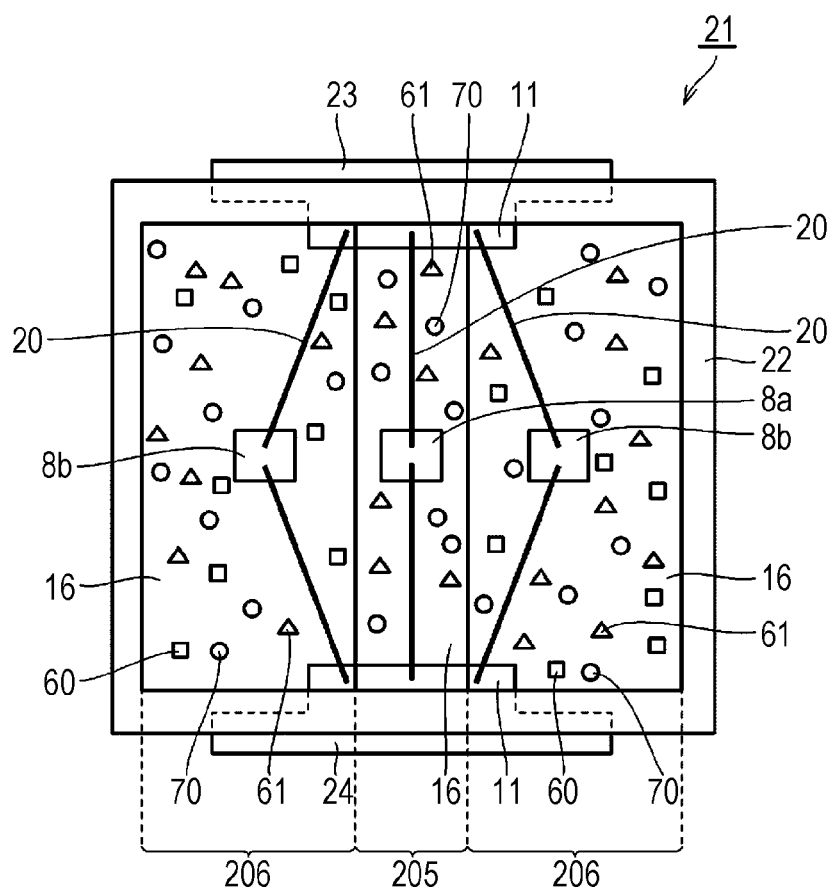
FIG. 5 is a transparent plan view schematically depicting a light-emitting device according to a second embodiment.
Figure 6:
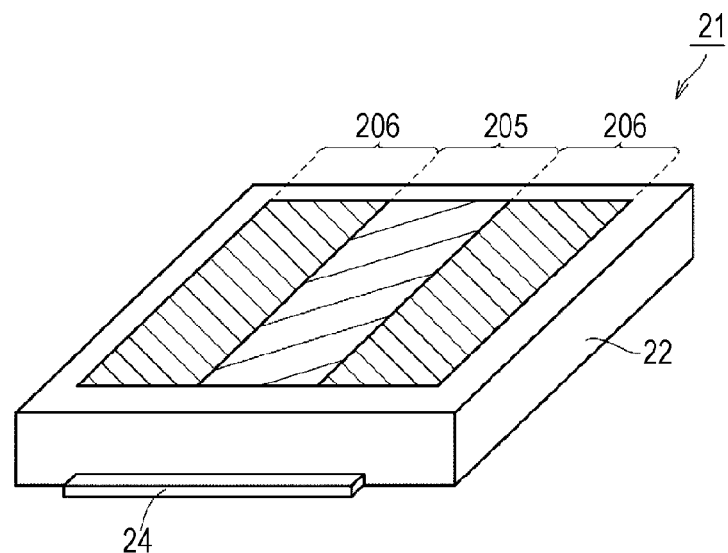
FIG. 6 is a schematic perspective view of the light-emitting device of FIG. 5.

A light-emitting device according to a second embodiment is described by using FIG. 5 and FIG. 6. FIG. 5 is a transparent plan view schematically depicting the light-emitting device according to the second embodiment. FIG. 6 is a schematic perspective view of the light-emitting device of FIG. 5.

As depicted in FIG. 5 and FIG. 6, a light-emitting device 21 includes a reflector 22 formed of a housing with an opening at the top, an anode electrode terminal 23 and a cathode electrode terminal 24 provided on side walls of the reflector 22, and a first light-emitting unit 205 at one location and second light-emitting units 206 at two locations electrically connected to the anode electrode terminal 23 and the cathode electrode terminal 24 and provided in parallel inside the reflector 22. The first light-emitting unit 205 and the second light-emitting units 206 are alternately and adjacently arranged.

As depicted in FIG. 5, the first light-emitting unit 205 includes second red phosphors 61, green phosphors 70, a blue light-emitting LED chip 8a, and a light-transmitting resin 16. The anode electrode terminal 23, one blue light-emitting LED chip 8a, and the cathode electrode terminal 24 are electrically connected in the above-described sequence via wire 20.

As depicted in FIG. 5, the second light-emitting unit 206 includes first red phosphors 60, second red phosphors 61, green phosphors 70, a blue light-emitting LED chip 8b, and the light-transmitting resin 16. The anode electrode terminal 23, one blue light-emitting LED chip 8b, and the cathode electrode terminal 24 are electrically connected in the above-described sequence via the wire 20.

In the light-emitting device 21, the first light-emitting unit 205 and the second light-emitting units 206 emit light by power supply from a single power source. Light emitted from the first light-emitting unit 205 and lights emitted from the second light-emitting units 206 are mixed and emitted outside as light from the light-emitting device 21.

In the light-emitting device 21, the blue light-emitting LED chip 8a included in the first light-emitting unit 205 and the blue light-emitting LED chips 8b included in the second light-emitting unit 206 have different amounts of change in forward-direction current with respect to the amount of change in voltage applied to each blue light-emitting LED chip (forward current-forward voltage characteristics). Therefore, when the magnitude of current applied to the light-emitting device 21 is changed, the color temperature of light emitted from the first light-emitting unit 205 and the color temperature of lights emitted from the second light-emitting units 206 are not changed, but a luminous flux ratio of light emitted from each light-emitting unit is changed. Therefore, by changing the magnitude of current applied to the light-emitting device 21, the color temperature of light from the entire light-emitting unit, that is, mixed light of lights emitted from the first light-emitting unit 205 and the second light-emitting unit 206, can be changed.

(Reflector)

In the light-emitting device 21, the first light-emitting unit 205 and the second light-emitting units 206 are provided inside the reflector 22. This causes light radiated from the blue light-emitting LED chips 8a and 8b, the red phosphors 60 and 61, and the green phosphors 70 to the sides of the light-emitting device to be diffused and reflected on the surface of the reflector and distributed to an axial direction of the light-emitting device. Therefore, the light emission intensity on the axis of the light-emitting device becomes high, allowing a light-emitting device with excellent light directivity to be acquired.

The reflector is formed of a housing with an opening at the top. At least an inner surface of the housing is made of a material with excellent light reflection properties or covered with a material with excellent light reflection properties. As the material of the reflector, for example, a polyamide-based resin, liquid-crystal polymer, silicone, or the like can be used.

The shape of the reflector is not particularly limited as long as it is a housing with an opening at the top and can distribute lights emitted from the blue light-emitting LED chips to the axial direction of the light-emitting device. For example, a shape formed by hollowing out a rectangular parallelepiped into a cone shape, a shape formed by hollowing out a cylinder into a cone shape, a shape formed by hollowing out a rectangular parallelepiped into a barrel shape (semi-columnar shape), or the like can be used.

Any size of the reflector can be selected as appropriate in accordance with the purpose of a lighting device for use. The size of the opening can be formed in, for example, a rectangle with each side equal to or longer than 2 mm and equal to or shorter than 20 mm, preferably equal to or longer than 3 mm and equal to or shorter than 6 mm, or a circle with a diameter equal to or longer than 2 mm and equal to or shorter than 20 mm, preferably equal to or longer than 3 mm and equal to or shorter than 6 mm. The depth of the space inside the housing can be, for example, equal to or longer than 1 mm and equal to or shorter than 5 mm.

(Anode Electrode Terminal, Cathode Electrode Terminal, and Leads)

The anode electrode terminal 23 and the cathode electrode terminal 24 are electrodes for external connection (for example, for the purpose of power supply). Note that the anode electrode terminal 23 and the cathode electrode terminal 24 correspond to the anode electrode land 13 and the cathode electrode land 14, respectively, of the first embodiment. That is, in the second embodiment, the electrode lands are referred to as electrode terminals. The anode electrode terminal 23 and the cathode electrode terminal 24 are made of a material such as Ag—Pt. The anode electrode terminal 23 and the cathode electrode terminal 24 are each provided so as to be at least partially exposed to the outside of the reflector 22. Inside the reflector 22, the anode electrode terminal 23 and the cathode electrode terminal 24 are connected to leads 11, and the leads 11 are electrically connected to the blue light-emitting LED chips 8a and 8b via the wires 20.

The leads 11 are formed of a copper alloy or the like, with their surface formed of Ag plating or the like.

(First Light-Emitting Unit and Second Light-Emitting Units)

The first light-emitting unit 205 and the second light-emitting units 206 (hereinafter also referred to as a "light-emitting unit" including both units) include the blue light-emitting LED chips 8a and 8b, the light-transmitting resin 16, and the green phosphors and the red phosphors uniformly dispersed in the light-transmitting resin. As the light-transmitting resin, the green phosphors, and the red phosphors, those similar to those in the first embodiment can be used.

In the light-emitting device 21 depicted in FIG. 5, the first light-emitting unit 205 and the second light-emitting units 206 are arranged inside the reflector 22 with a rectangular opening. Note that the shape of the opening is not limited to the rectangle, and any shape can be adopted, such as a quadrangle such as a square or rhombus, circle, oval, polygon, or the like.

Of sections acquired by dividing the opening of the reflector 22 into three by straight lines, the first light-emitting unit 205 is arranged in a section arranged at center, and the second light-emitting units 206 at two locations are arranged in second sections arranged on both sides of the first section. In FIG. 5, the first light-emitting unit 205 and the second light-emitting units 206 are adjacent on boundary lines, and lights emitted from the light-emitting units of the respective first light-emitting unit 205 and second light-emitting units 206 thus become easily mixed, allowing the entire light-emitting unit to emit light at a more uniform color temperature. Note that although the first light-emitting unit 205 and the second light-emitting units 206 are preferably arranged adjacently, the first light-emitting unit and the second light-emitting units do not have to make contact with each other as long as lights emitted from the light-emitting units of the respective first light-emitting unit and second light-emitting units can be mixed together. In this case, the first light-emitting unit and the second light-emitting units are preferably arranged in a distance as near as lights emitted from the respective light-emitting units can be sufficiently mixed together.

The shape of a top plane of the entire light-emitting unit including the first light-emitting unit and the second light-emitting units is not limited to the rectangle as in FIG. 5 as long as lights emitted from the light-emitting units of the respective first light-emitting unit and second light-emitting units can be mixed together. For example, as the shape of the top plane of the entire light-emitting unit, any shape can be adopted, such as a circle, oval, or polygon. The shape of each of the first light-emitting unit and the second light-emitting units arranged inside the entire light-emitting unit is also not particularly limited. For example, it is preferable so that the surface area of the first light-emitting unit and the surface area of the second light-emitting unit are equal to each other. Also, if the color temperatures of lights emitted from the light-emitting units of the respective first light-emitting unit and second light-emitting units can be adjusted, the surface area of the first light-emitting unit and the surface area of the second light-emitting unit may be different.

Arrangement of the first light-emitting unit and the second light-emitting units is not particularly limited as long as lights emitted from the light-emitting units of the respective first light-emitting unit and second light-emitting units can be mixed together. For example, the rectangular opening of the reflector is divided by a straight line into two, and the first light-emitting unit can be arranged in one section, and the second light-emitting units can be arranged in other two sections. Also, the first light-emitting unit is formed in a circular shape, and the second light-emitting units can be arranged in a donut shape so as to surround the outer periphery of the first light-emitting unit. According to this, lights emitted from the light-emitting units of the respective first light-emitting unit and second light-emitting units become easily mixed, allowing the entire light-emitting unit to emit light at a more uniform color temperature.

(Blue Light-Emitting LED Chips)

As the blue light-emitting LED chips 8a and 8b, those similar to the blue light-emitting LED chips 8 of the first embodiment can be used. However, the blue light-emitting LED chips 8a included in the first light-emitting unit and the blue light-emitting LED chips 8b included in the second light-emitting unit have different amounts of change in forward-direction current with respect to the amount of change in voltage applied to each blue light-emitting LED chip (forward current-forward voltage characteristics). Therefore, with respect to the amount of change in magnitude of current applied to the light-emitting device 21, the amount of change in luminous flux of light emitted from the first light-emitting unit 205 and the amount of change in luminous flux of light emitted from the second light-emitting unit 206 are different. Thus, by changing the magnitude of current applied to the light-emitting device 21, the color temperature of light emitted from the first light-emitting unit 205 and the color temperature of light emitted from the second light-emitting unit 206 are not changed, but a luminous flux ratio of light emitted from each light-emitting unit is changed, and thus the color temperature of light emitted from the entire light-emitting device is changed.

In the light-emitting unit, part of primary light (for example, blue light) radiated from the blue light-emitting LED chips 8a and 8b is converted by the green phosphors and the red phosphors into green light and red light. Thus, the light-emitting device according to the present embodiment emits light with the primary light, the green light, and the red light mixed together, and suitably emits white-based light. Note that a mixture ratio of the green phosphors and red phosphors is not particularly restricted, and the mixture ratio is preferably set so that a desired characteristic is achieved.

In the present embodiment, it is possible to dispense with means which connects resistors to the leads 11 to change the magnitude of current flowing through the first light-emitting unit 205 and the second light-emitting units 206. Therefore, the light-emitting device 21 can decrease a power loss due to resistors and can have excellent luminous efficiency even if the value of the applied current increases.

When the current flowing through the light-emitting unit is set to have a rated current value, the color temperature (hereinafter also referred to as Tcmax) of light emitted from the entire light-emitting device with a mixture of light emitted from the first light-emitting unit and the light emitted from the second light-emitting units is preferably 2700 K to 6500 K. If the magnitude of current is set smaller than the rated current value, the luminous fluxes of lights emitted from the first light-emitting unit and the second light-emitting units become smaller, the luminous flux of light emitted from the entire light-emitting device (light-emitting unit) becomes smaller, and the color temperature is decreased. With the luminous flux of light emitted from the entire light-emitting device being taken as 100% when the current flowing through the light-emitting unit is set to have a rated current value and the luminous flux of light emitted from the entire light-emitting device being adjusted to be 20% by making the magnitude of current smaller, the color temperature of light emitted from the entire light-emitting device is preferably smaller than Tcmax by 300 K or more, in view of allowing acquirement of a wide range of color temperatures.

Figure 7:
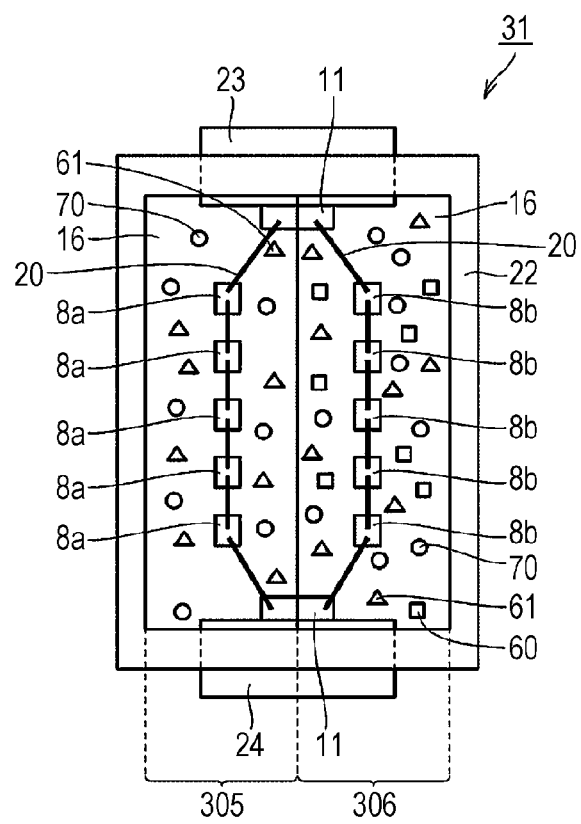
FIG. 7 is a transparent plan view of a modification example of the light-emitting device of FIG. 5.
Figure 8:
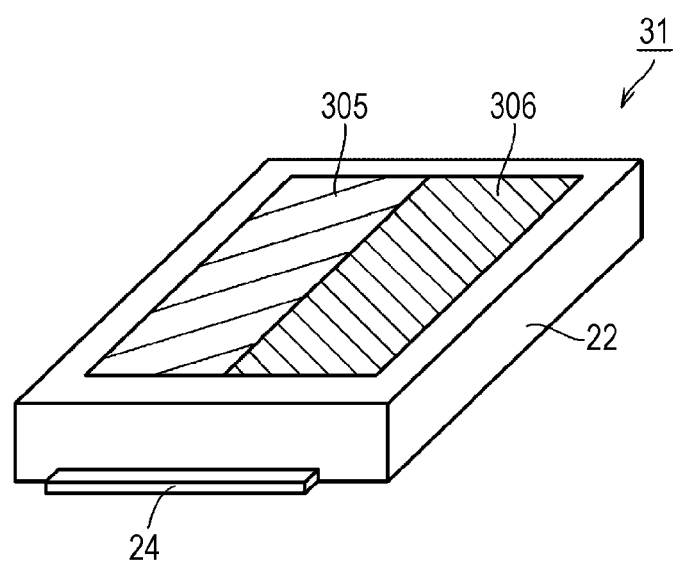
FIG. 8 is a schematic perspective view of the light-emitting device of FIG. 6.

A modification example of the light-emitting device according to the second embodiment is described by using FIG. 7 and FIG. 8. FIG. 7 is a transparent plan view of the modification example of the light-emitting device of FIG. 5. FIG. 8 is a schematic perspective view of the light-emitting device of FIG. 7.

A light-emitting device 31 depicted in FIG. 7 and FIG. 8 basically includes a structure similar to that of the light-emitting device 21 depicted in FIG. 5 and FIG. 6. In the structure of the light-emitting device 31, differences from the light-emitting device 21 are that a first light-emitting unit 305 at one location and a second light-emitting unit 306 at one location are included inside the reflector 22, that five blue light-emitting LED chips 8a connected in series are included in the first light-emitting unit 305, and that five blue light-emitting LED chips 8b connected in series are included in the second light-emitting unit 306. In the light-emitting device 31, the first light-emitting unit 305 and the second light-emitting unit 306 have the same number of blue light-emitting LED chips 8a or 8b with different forward current-forward voltage characteristics. Thus, when the magnitude of current applied to the light-emitting device 31 is changed, the color temperature of light emitted from the first light-emitting unit 305 and the color temperature of light emitted from the second light-emitting unit 306 are not changed, but a luminous flux ratio of light emitted from each light-emitting unit is changed. Therefore, the color temperature of light from the entire light-emitting unit, that is, mixed light of lights emitted from the first light-emitting unit 305 and the second light-emitting unit 306, can be changed.

In the present modification example, the numbers of blue light-emitting LED chips 8a and 8b in series inside the first light-emitting unit 305 and the second light-emitting unit 306 may be any number equal to or larger than two as long as they are the same. Also, the number of the first light-emitting units and the number of second light-emitting units arranged in parallel are not particularly limited, and may be the same or different.

[Third Embodiment]

Figure 9:
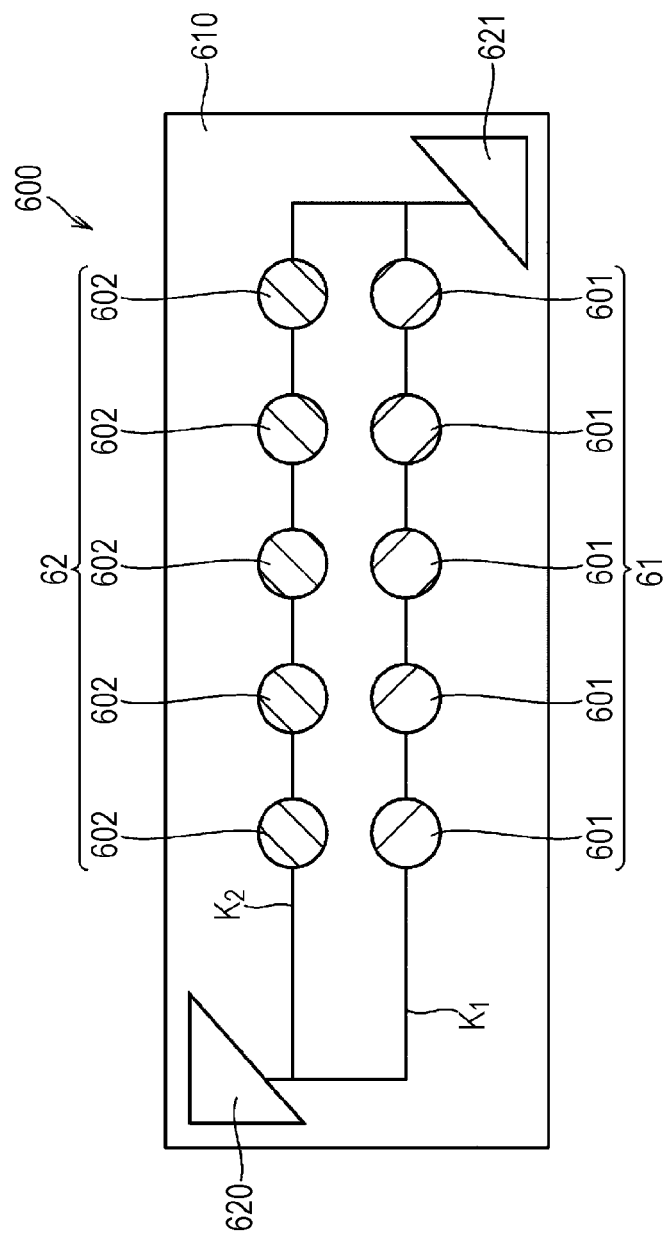
FIG. 9 is a plan view schematically depicting a light-emitting device according to a third embodiment.

FIG. 9 is a plan view schematically depicting a light-emitting device according to a third embodiment of the present invention.

A light-emitting device 600 according to the present embodiment basically includes a structure similar to that of the light-emitting device 1 according to the first embodiment. Differences from the first embodiment are that five first piece light-emitting units 601 are connected in series on a wiring $K_1$ in a first light-emitting unit 61, that five second piece light-emitting units 602 are connected in series on a wiring $K_2$ in a second light-emitting unit 62, that the first piece light-emitting units 601 and the second piece light-emitting units 602 are not adjacent and are arranged in a distance as near as lights emitted from the respective piece light-emitting units can be sufficiently mixed together, that an anode electrode land 621 and a cathode electrode land 620 each have a shape of a right-angled triangle with two orthogonal sides installed in parallel with substrate end sides of a substrate 610, and that the wirings $K_1$ and $K_2$ are directly connected to the anode electrode land 621 and the cathode electrode land 620.

As depicted in FIG. 9, the light-emitting device 600 includes the anode electrode land 621, the cathode electrode land 620, and the wirings $K_1$ and $K_2$ connecting the anode electrode land 621 and the cathode electrode land 620, arranged on the substrate 610. The light-emitting unit 61 includes the five first piece light-emitting units 601 electrically connected in series on the wiring $K_1$ and the five second piece light-emitting units 602 electrically connected in series on the wiring $K_2$. The first piece light-emitting units 601 and the second piece light-emitting units 602 are arranged in a distance as near as lights emitted from the respective piece light-emitting units can be sufficiently mixed together, and light emitted from the entire light-emitting device thus becomes light at a uniform color temperature. A distance between the first piece light-emitting units and the second piece light-emitting units is such that a minimum distance between outer peripheries of the respective piece light-emitting units is preferably equal to or shorter than 28 mm, further preferably equal to or shorter than 22 mm. If the distance between the first piece light-emitting units and the second piece light-emitting units is equal to or shorter than 28 mm, lights emitted from the respective first light-emitting unit and second light-emitting unit can be sufficiently mixed together.

The plurality of first piece light-emitting units 601 can each include blue light-emitting LED chips, red phosphors, green phosphors, and a light-transmitting resin. The plurality of second piece light-emitting units 602 can each include blue light-emitting LED chips, red phosphors, green phosphors, and a light-transmitting resin.

When the number of blue light-emitting LED chips included in each of the first piece light-emitting units 601 and the number of blue light-emitting LED chips included in each of the second piece light-emitting units 602 are the same and the blue light-emitting LED chips included in the first piece light-emitting unit 601 and the blue light-emitting LED chips 603 included in the second piece light-emitting unit 602 have different amounts of change in forward-direction current with respect to the amount of change in voltage applied to each blue light-emitting LED chip (forward current-forward voltage characteristics), if the magnitude of current applied to the light-emitting device 600 is changed, the color temperature of light emitted from the first piece light-emitting unit 601 and the color temperature of light emitted from the second piece light-emitting unit 602 are not changed, but a luminous flux ratio of light emitted from each piece light-emitting unit is changed. Therefore, the color temperature of light emitted from the entire light-emitting unit, that is, mixed light of lights emitted from the plurality of first piece light-emitting units 601 and the plurality of second piece light-emitting units 602, can be changed.

In the present embodiment, it is possible to dispense with means which connects resistors to the wiring $K_1$ and the wiring $K_2$ to change the magnitude of current flowing through the first light-emitting unit 61 and the second light-emitting unit 62. Therefore, the light-emitting device 600 can decrease a power loss due to resistors and can have excellent luminous efficiency even if the value of the applied current increases.

The anode electrode land 621 and the cathode electrode land 620 each have a shape of a right-angled triangle, and each electrode land thus allows external terminal connection from three directions.

Figure 10:
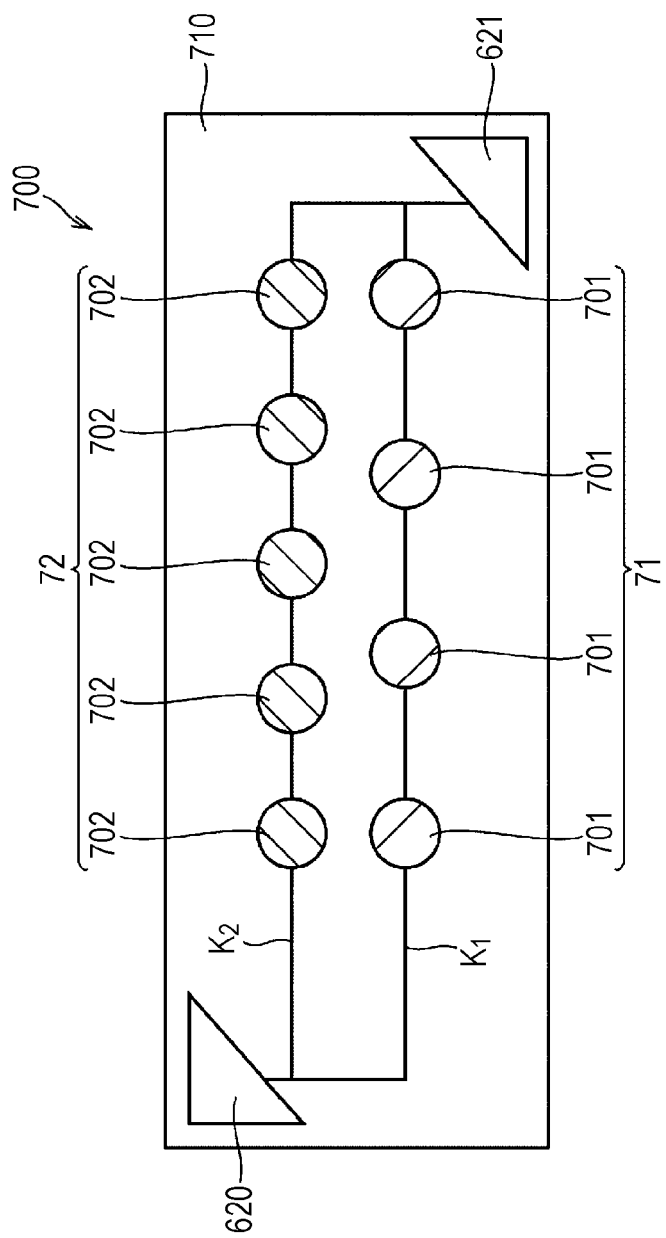
FIG. 10 is a plan view of a modification example of the light-emitting device of FIG. 9.

FIG. 10 is a plan view of a modification example of the light-emitting device according to the third embodiment of the present invention. In the present modification example, four first piece light-emitting units 701 are connected in series on a wiring $K_1$ in a first light-emitting unit 71, and five first piece light-emitting units 702 are connected in series on a wiring $K_2$ in a second light-emitting unit 72. That is, in the present modification example, the number of first piece light-emitting units connected in series and the number of second piece light-emitting units connected in series are different.

When the number of blue light-emitting LED chips included in each of the first piece light-emitting units 701 and the number of blue light-emitting LED chips included in each of the second piece light-emitting units 702 are the same and the blue light-emitting LED chips included in the first piece light-emitting unit 701 and the blue light-emitting LED chips included in the second piece light-emitting unit 702 have different amounts of change in forward-direction current with respect to the amount of change in voltage applied to each blue light-emitting LED chip (forward current-forward voltage characteristics), if the magnitude of current applied to the light-emitting device 700 is changed, the color temperature of light emitted from the first piece light-emitting unit 701 and the color temperature of light emitted from the second piece light-emitting unit 702 are not changed, but a luminous flux ratio of light emitted from each piece light-emitting unit is changed. Therefore, the color temperature of light emitted from the entire light-emitting unit, that is, mixed light of lights emitted from the plurality of first piece light-emitting units 701 and the plurality of second piece light-emitting units 702, can be changed.

In the present modification example, the blue light-emitting LED chips included in the first piece light-emitting unit 701 and the blue light-emitting LED chips included in the second piece light-emitting unit 702 have the same amount of change in forward-direction current with respect to the amount of change in voltage applied to each blue light-emitting LED chip (forward current-forward voltage characteristics), but each number of piece light-emitting units is different. Thus, by changing current applied to the light-emitting device, the color temperature of light from the entire light-emitting unit can be changed.

The number of blue light-emitting LED chips included in each of the first piece light-emitting units 701 and the number of blue light-emitting LED chips included in each of the second piece light-emitting units 702 can be any as long as the number is equal to or larger than one.

As long as the number of first piece light-emitting units and the number of second piece light-emitting units are different, either of the numbers of light-emitting units may be larger. The first piece light-emitting units and the second piece light-emitting units may be each arranged inside the reflector, or may be of a surface-mounting type or in a dome shape.

[Fourth Embodiment]

Figure 11:
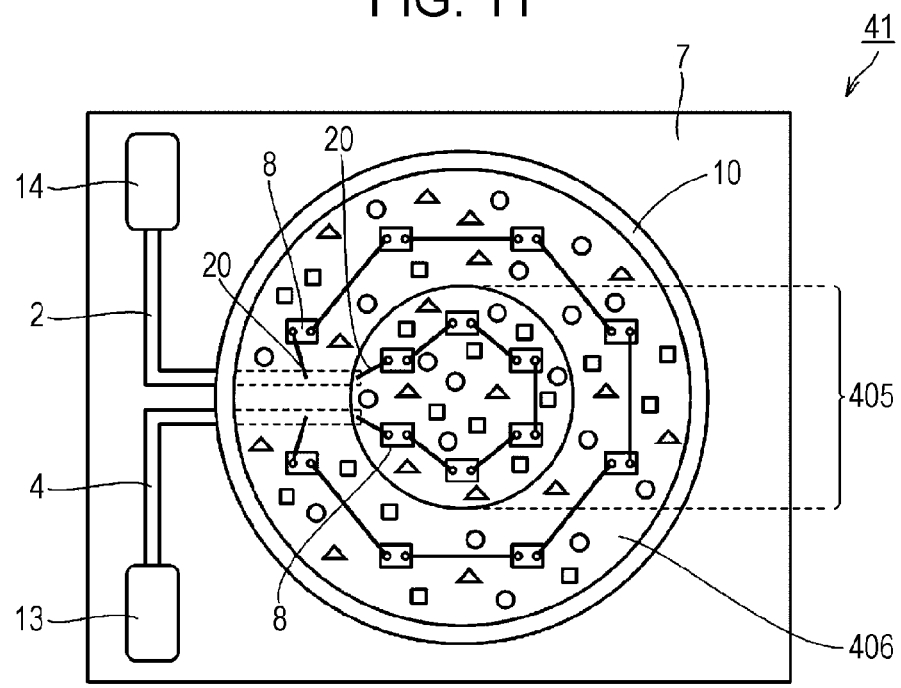
FIG. 11 is a transparent plan view schematically depicting a light-emitting device according to a fourth embodiment.

FIG. 11 is a transparent plan view schematically depicting a light-emitting device according to a fourth embodiment.

A light-emitting device 41 according to the present embodiment basically includes a structure similar to that of the light-emitting device 1 according to the first embodiment. Differences from the first embodiment are that a donut-shaped second light-emitting unit 406 is arranged so as to surround the periphery of a circular first light-emitting unit 405, that six blue light-emitting LED chips 8 are connected in series in the first light-emitting unit 405, that eight blue light-emitting LED chips 8 are connected in series in the second light-emitting unit 406, that a wiring $K_1$ and a wiring $K_2$ each have its one end connected to a wiring pattern 25$a$ and the other end connected to a wiring pattern 25$b$.

In the present embodiment, the first light-emitting unit 405 and the second light-emitting unit 406 are concentrically arranged, and light emitted from the entire light-emitting device thus becomes more uniform light in all directions.

Figure 12:
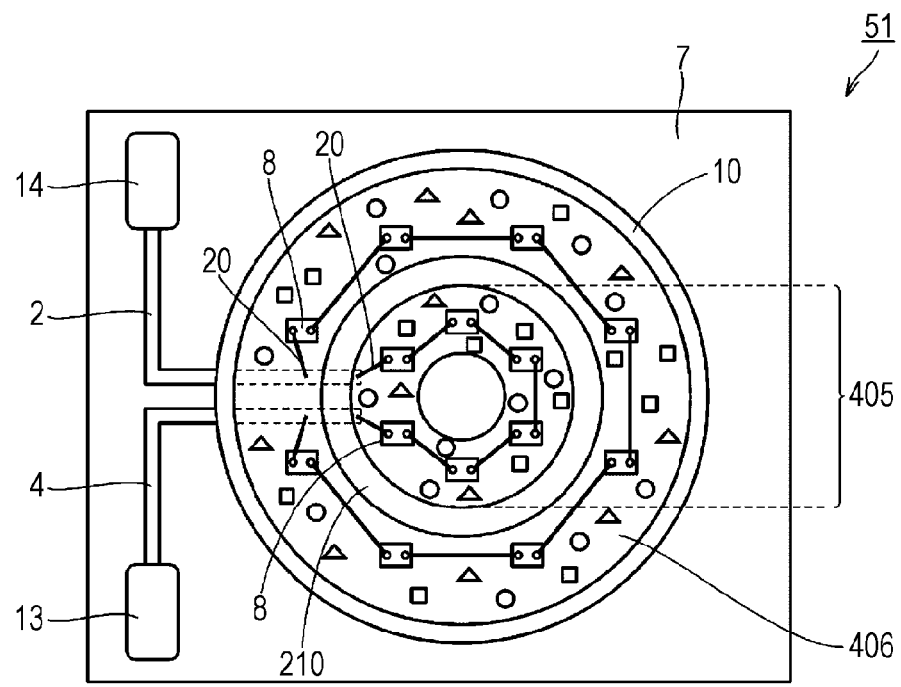
FIG. 12 is a transparent plan view of a modification example of the light-emitting device of FIG. 11.

FIG. 12 is a transparent plan view of a modification example of the light-emitting device 41 according to the fourth embodiment. As depicted in FIG. 12, in a light-emitting device 51, a resin dam 210 is provided between the first light-emitting unit 405 and the second light-emitting unit 406. According to this, it is possible to inhibit a mixture of a light-transmitting resin including phosphors forming the first light-emitting unit 405 and a light-transmitting resin including phosphors forming the second light-emitting unit 406 and inhibit mixture and intrusion of the phosphors included in each light-emitting unit.

[Fifth Embodiment]

Figure 13:
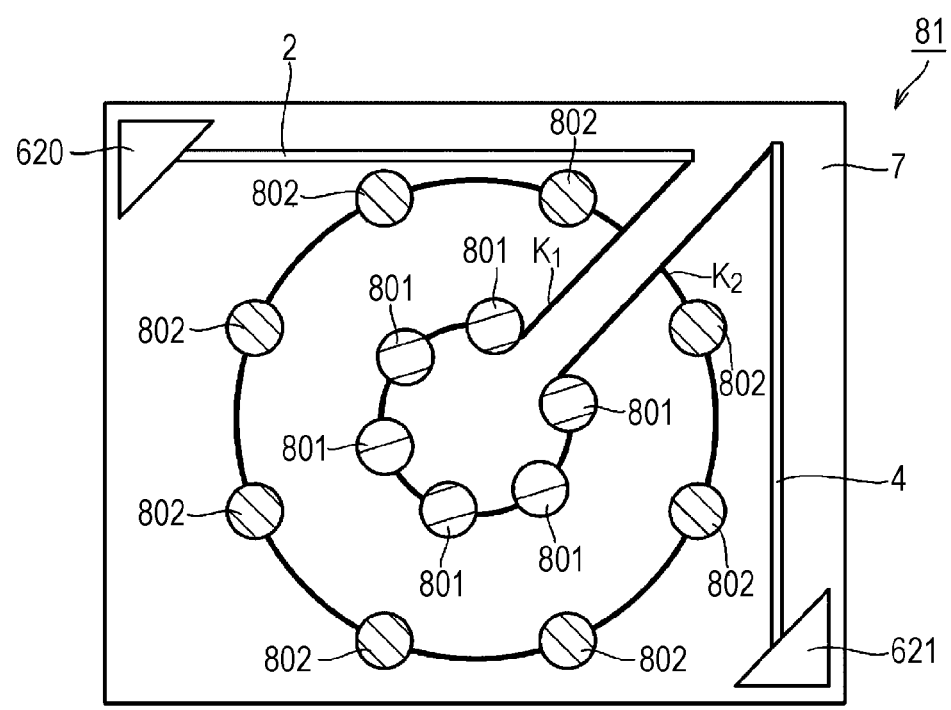
FIG. 13 is a plan view schematically depicting a light-emitting device according to a fifth embodiment.

FIG. 13 is a plan view schematically depicting a light-emitting device according to a fifth embodiment.

A light-emitting device 81 according to the present embodiment basically includes a structure similar to that of the light-emitting device 700 according to the modification example of the third embodiment. Differences from the light-emitting device 700 are that six circular first piece light-emitting units 801 are arranged on the circumference of the same circle and that eight circular second piece light-emitting units 802 are arranged outside the circumference formed of the first piece light-emitting units 801.

In the present embodiment, six first piece light-emitting units 801 and eight second piece light-emitting units 802 are arranged on the circumferences of concentric circles, and light emitted from the entire light-emitting device thus becomes more uniform in all directions.

EXAMPLES

The present invention is further specifically described based on examples. However, the present invention is not limited by these examples.

First Example

In a first example, tests were performed by using a light-emitting device configured similarly to that of FIG. 1 and FIG. 2 of the first embodiment.

As the substrate 7, a ceramic substrate was used. In the first light-emitting units 5 and the second light-emitting units 6, the first red phosphors 60 ($CaAlSiN_3:Eu$), the second red phosphors 61 ($(Sr, Ca)AlSiN_3:Eu$), the green phosphors 70 ($Lu_3Al_5O_{12}:Ce$), and the blue light-emitting LED chips 8 (with a luminous wavelength of 450 nm) are sealed with a silicone resin. The viscosity of the phosphor-containing silicone resin forming the first light-emitting unit 5 is larger than the viscosity of the phosphor-containing silicone resin forming the second light-emitting unit 6. Therefore, the second light-emitting units 6 were formed after the first light-emitting units 5 were formed.

In each of the first light-emitting units 5 at two locations, nine blue light-emitting LED chips 8 are connected in series. In each of the second light-emitting units 6 at three locations, ten blue light-emitting LED chips 8 are connected in series. The blue light-emitting LED chips 8 are electrically connected via the wires 20 to any of the wiring patterns 25a, 25b, and 25c. The wiring pattern 25a is electrically connected to the anode electrode land 13 via the lead wiring 4. The wiring pattern 25b is electrically connected to the cathode electrode land 14 via the lead wiring 3. The wiring pattern 25c is electrically connected to the cathode electrode land 14 via the lead wiring 2.

The light-emitting device of the first example is formed so that the color temperature of light emitted from the first light-emitting unit 5 is 2000 K and the color temperature of light emitted from the second light-emitting unit 6 is 3000 K. Next, a relation between the magnitude of a total of forward-direction currents flowing through the first light-emitting units 5 and the second light-emitting units 6 (hereinafter also referred to as a total forward-direction current) and the color temperature of light emitted from the light-emitting device was studied.

The color temperature of light emitted from the entire light-emitting device when a total forward-direction current of 350 mA flew was 2900 K, and the color temperature of light emitted from the entire light-emitting device when a total forward-direction current of 50 mA flew was 2000 K.

Figure 4:
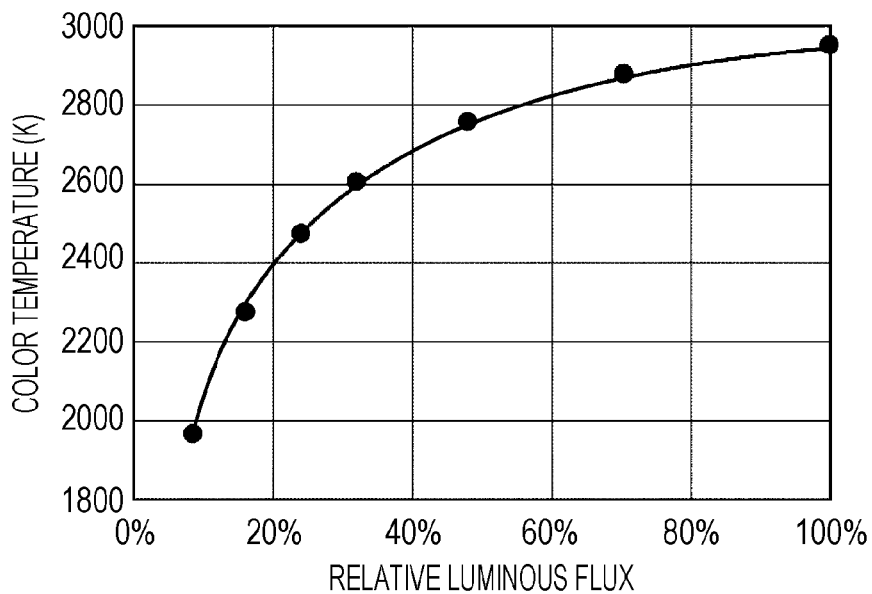
FIG. 4 is a graph depicting a relation between relative luminous flux of light emitted from a light-emitting device of a first example and color temperature.

FIG. 4 is a graph depicting a relation between relative luminous flux (%) of light and color temperature when the total forward-direction current is changed, with the luminous flux of light emitted from the entire light-emitting device at the time of a total forward-direction current of 350 mA being taken as 100%. From FIG. 4, it can be found that the color temperature decreases when the relative luminous flux decreases.

It should be understood that the embodiments and the examples disclosed this time are exemplarily made illustrative in all aspects and are not restrictive. The scope of the present invention is indicated not by the above-described embodiments but by the scope of the claims for patent, and is intended to include all modifications within the sense and scope of the equivalents of the scope of the claims for patent.

REFERENCE SIGNS LIST 1, 21, 31, 41, 51, 81, 600, 700 light-emitting device
2, 3, 4 lead wiring
5, 205, 305, 405 first light-emitting unit
6, 206, 306, 406 second light-emitting unit
7, 610, 710 substrate
8, 8a, 8b blue light-emitting LED chip
10, 210 resin dam
13, 621 anode electrode land
14, 620 cathode electrode land
16, 17 light-transmitting resin
20 wire
22 reflector
25a, 25b, 25c wiring pattern
60 first red phosphor
61 second red phosphor
70 green phosphor
601, 701, 801 first piece light-emitting unit
602, 702, 802 second piece light-emitting unit
$K_1$, $K_2$ wiring

The invention claimed is:

1. A light-emitting device comprising:
an anode electrode land;
a cathode electrode land; and
a first light-emitting unit and a second light-emitting unit electrically connected to the anode electrode land and the cathode electrode land and provided in parallel to each other,
wherein the first light-emitting unit and the second light-emitting unit each include blue light-emitting LED chips,
the first light-emitting unit and the second light-emitting unit have different amounts of change in luminous flux from each other with respect to an amount of change in current applied between the anode electrode land and the cathode electrode land,
a color temperature generated from an entire light-emitting unit including the first light-emitting unit and the second light-emitting unit can be adjusted, and
the color temperature of light emitted from the first light-emitting unit and the color temperature of light emitted from the second light-emitting unit are different from each other.

2. The light-emitting device according to claim 1, wherein the first light-emitting unit and the second light-emitting unit each include a different number of the blue light-emitting LED chips.

3. The light-emitting device according to claim 1, wherein the blue light-emitting LED chips included in the first light-emitting unit and the blue light-emitting LED chips included in the second light-emitting unit have different amounts of change in forward-direction current with respect to an amount of change in applied voltage (forward current-forward voltage characteristics).

4. The light-emitting device according to claim 1, wherein the first light-emitting unit includes a plurality of first piece light-emitting units connected in series, and the second light-emitting unit includes a plurality of second piece light-emitting units connected in series.

5. The light-emitting device according to claim 1, wherein the first light-emitting unit and the second light-emitting unit each include phosphors of at least two types, and a content rate of all phosphors included in the first light-emitting unit and a content rate of all phosphors included in the second light-emitting unit are different.

\* \* \* \* \*